United States Patent
Lee et al.

(10) Patent No.: US 8,564,138 B2
(45) Date of Patent: Oct. 22, 2013

(54) SEMICONDUCTOR INTEGRATED CIRCUIT HAVING A THREE-DIMENSIONAL (3D) STACK PACKAGE STRUCTURE

(75) Inventors: Kang-Seol Lee, Gyeonggi-do (KR); Jae-Jin Lee, Gyeonggi-do (KR); Jae-Hyuk Im, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 41 days.

(21) Appl. No.: 13/196,320

(22) Filed: Aug. 2, 2011

(65) Prior Publication Data

US 2012/0267790 A1 Oct. 25, 2012

(30) Foreign Application Priority Data

Apr. 21, 2011 (KR) .......................... 10-2011-0037482

(51) Int. Cl.
*H01L 23/48* (2006.01)
(52) U.S. Cl.
USPC ........................................................ 257/774
(58) Field of Classification Search
USPC .......................................... 257/202, 207, 744
See application file for complete search history.

(56) References Cited

U.S. PATENT DOCUMENTS

2011/0193199 A1* 8/2011 Filippi et al. .................. 257/621

FOREIGN PATENT DOCUMENTS

KR 1020090011769 2/2009

OTHER PUBLICATIONS

Office Action issued by the Korean Intellectual Property Office on Mar. 26, 2012.

* cited by examiner

*Primary Examiner* — Thao Le
*Assistant Examiner* — Laura Dykes
(74) *Attorney, Agent, or Firm* — IP & T Group LLP

(57) ABSTRACT

A semiconductor integrated circuit includes a semiconductor chip, a plurality of first through-chip vias formed vertically through the semiconductor chip and configured to operate as an interface for a first power supply, and a first common conductive layer provided over the semiconductor chip and coupling the plurality of first through-chip vias to each other in a horizontal direction.

17 Claims, 6 Drawing Sheets

SEMICONDUCTOR INTEGRATED CIRCUIT HAVING A THREE-DIMENSIONAL (3D) STACK PACKAGE STRUCTURE

CROSS-REFERENCE TO RELATED APPLICATIONS

The present application claims priority of Korean Patent Application No. 10-2011-0037482, filed on Apr. 21, 2011, which is incorporated herein by reference in its entirety.

BACKGROUND

1. Field

Exemplary embodiments of the present invention relate to semiconductor design technology, and more particularly, to a semiconductor integrated circuit having a three-dimensional (3D) stack package structure.

2. Description of the Related Art

Packaging technology for semiconductor integrated circuits are being further advanced for miniaturization and mounting reliability. In accommodating the high performance of electrical and electronic products while pursuing the miniaturization of electrical and electronic products, a stack package technology is used.

Here, "stack" means vertically stacking at least two or more semiconductor chips or packages. When a stack package is used for a semiconductor memory device, a product having a memory capacity two or more times larger than a memory capacity may be obtained. Furthermore, the stack package increases not only the memory capacity but also the packaging density and the efficiency in use of mounting area. Therefore, the stack package technology is useful.

Here, a stack package may be fabricated according to the following methods. According to a first method, individual semiconductor chips may be stacked, and then packaged at once. According to a second method, packaged individual semiconductor chips may be stacked. The individual semiconductor chips of the stacked semiconductor package are electrically coupled through metallic wires or through silicon vias (TSV). The stack package using TSVs has a structure where the physical and electrical coupling between the semiconductor chips is vertically achieved by TSVs formed in the respective semiconductor chips.

FIG. 1 is a side cross-sectional view of a conventional semiconductor integrated circuit. FIG. 2 is a plan view of a fourth semiconductor chip illustrated in FIG. 1.

Referring to FIGS. 1 and 2, the semiconductor integrated circuit 100 includes first to fourth semiconductor chips 110 to 140, a plurality of first through-chip vias 150A to 150C, a plurality of second through-chip vias 160A to 160C, a plurality of third through-chip vias 170A to 170E, and a plurality of coupling pads BP11 to BP13. The first to fourth semiconductor chips 110 to 140 are stacked vertically. The plurality of first through-chip vias 150A to 150C are vertically formed through the first to fourth semiconductor chips 110 to 140 at a plurality of first positions corresponding to the respective first through-chip vias and configured to operate as an interface for a first power supply Power 1. The plurality of second through-chip vias 160A to 160C are vertically formed through the first to fourth semiconductor chips 110 to 140 at a plurality of second positions corresponding to the respective second through-chip vias and configured to operate as an interface for a second power supply Power 2. The plurality of third through-chip vias 170A to 170E are vertically formed through the first to fourth semiconductor chips 110 to 140 at a plurality of third positions corresponding to the respective third through-chip vias and configured to operate as an interface for a variety of signals. The plurality of coupling pads BP11 to BP13 are provided between the respective through-chip vias 150A to 150C, 160A to 160C, and 170A to 170C and configured to electrically couple is corresponding through-chip vias.

The first to fourth semiconductor chips 110 to 140 may be fabricated by the same process. In this case, the first master chip 110 positioned at the lowermost position serves as a master chip, and the other semiconductor chips 120 to 140 serve as slave chips.

Since the plurality of first to third through-chip vias 150A to 150C, 160A to 160C, and 170A to 170E are configured to operate as an interface for power supplies or signals, they may be formed of a metal having an excellent conductivity. For example, copper (Cu) may be used. The plurality of first to third through-chip vias 150A to 150C, 160A to 160C, and 170A to 170E include TSVs.

Furthermore, the plurality of coupling pads BP11 to BP13 refer to bump pads.

In accordance with the semiconductor integrated circuit 100 configured in the above-described manner, a variety of signals or power supplies are transferred through the plurality of first to third through-chip vias 150A to 150C, 160A to 160C, and 170A to 170E. Therefore, current consumption and signal delay may be minimized, and operation performance may be enhanced with an improved bandwidth.

However, the conventional semiconductor integrated circuit 100 has the following features.

Each of the first to fourth semiconductor chips 110 to 140 includes an active layer formed on the upper surface thereof, and a variety of circuits are provided in the active layer. However, according to the trend for high integration, only a minimum number of circuits are left, and unnecessary circuits are removed, in order to reduce the size of the first to fourth semiconductor chips 110 to 140. The circuits which are usually removed may include circuits for stabilizing a power supply (for example, a reservoir capacitor). Furthermore, the first and second through-chip vias 150A to 150C and 160A to 160C for interfacing power supplies have a vertical structure in which they are vertically coupled, where the vertical structure is vulnerable to an ohmic drop. Here, as the number of stacked semiconductor chips increases, the number of through-chip vias to be coupled to the semiconductor chips also increases. As to through-chip vias stacked at the upper positions, they have access to lower power supplies due to an ohmic drop that inevitably occurs. In this case, a malfunction may occur due to an unstable signal transmission, and high-speed operations may not be performed properly due to unstable asynchronous characteristics.

Furthermore, the conventional semiconductor integrated circuit 100 may not properly analyze errors in transferring signals through the plurality of third through-chip vias 170A to 170E in a package state.

SUMMARY

An embodiment of the present invention is directed to a semiconductor integrated circuit capable of maintaining stabilized power supply, while the size thereof is not increased.

Another embodiment of the present invention is directed to a semiconductor integrated circuit capable of performing precise signal transfer fail analysis through signal monitoring in a package state.

In accordance with an embodiment of the present invention, a semiconductor integrated circuit includes: a semiconductor chip; a plurality of first through-chip vias formed vertically through the semiconductor chip and configured to operate as an interface for a first power supply; and a first common conductive layer provided over the semiconductor chip and coupling the plurality of first through-chip vias to each other in a horizontal direction.

In accordance with another embodiment of the present invention, a semiconductor integrated circuit includes: a plurality of semiconductor chips stacked in a vertical direction; a plurality of first through-chip vias formed vertically through the plurality of semiconductor chips, and configured to operate as an interface for a first power supply; and a first common conductive layer provided over a semiconductor chip stacked at the uppermost position among the plurality of stacked semiconductor chips, and coupling the plurality of first through-chip vias to each other in a horizontal direction.

In accordance with yet another embodiment of the present invention, a semiconductor integrated circuit includes: a plurality of semiconductor chips stacked in a vertical direction; a plurality of first through-chip vias formed vertically through the plurality of semiconductor chips at a plurality of first positions corresponding to the first through-chip vias, respectively, and configured to operate as an interface for a first power supply; a first common conductive layer provided over a semiconductor chip stacked at the uppermost position among the plurality of semiconductor chips, and coupling the plurality of first through-chip vias in a horizontal direction; a plurality of second through-chip vias formed vertically through the plurality of semiconductor chips at a plurality of second positions corresponding to the second through-chip vias, respectively, and configured to operate as an interface for a second power supply; and a plurality of coupling pads arranged in a same layer as the first common conductive layer and coupled to the second through-chip vias, respectively.

DETAILED DESCRIPTION

Figure 1:
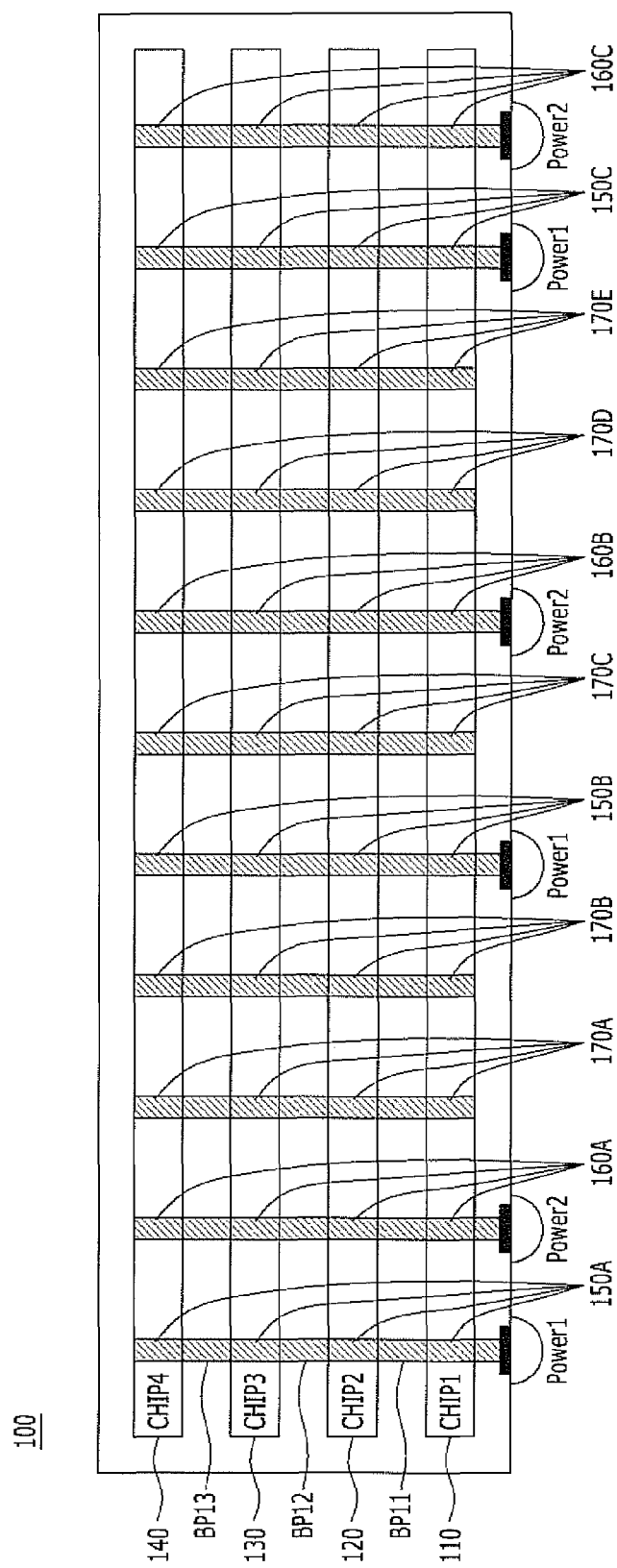
FIG. 1 is a side cross-sectional view of a conventional semiconductor integrated circuit.
Figure 2:
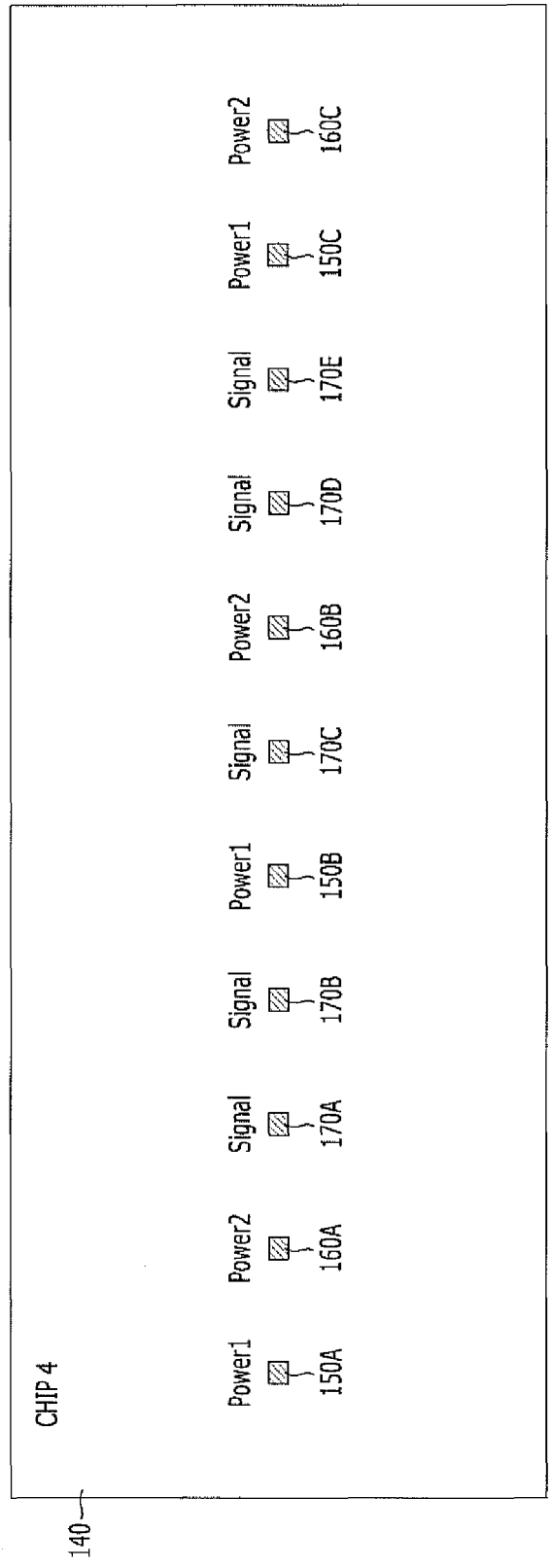
FIG. 2 is a plan view of a fourth semiconductor chip illustrated in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In the embodiments of the present invention, a case in which four semiconductor chips are stacked will be taken as an example.

Figure 3:
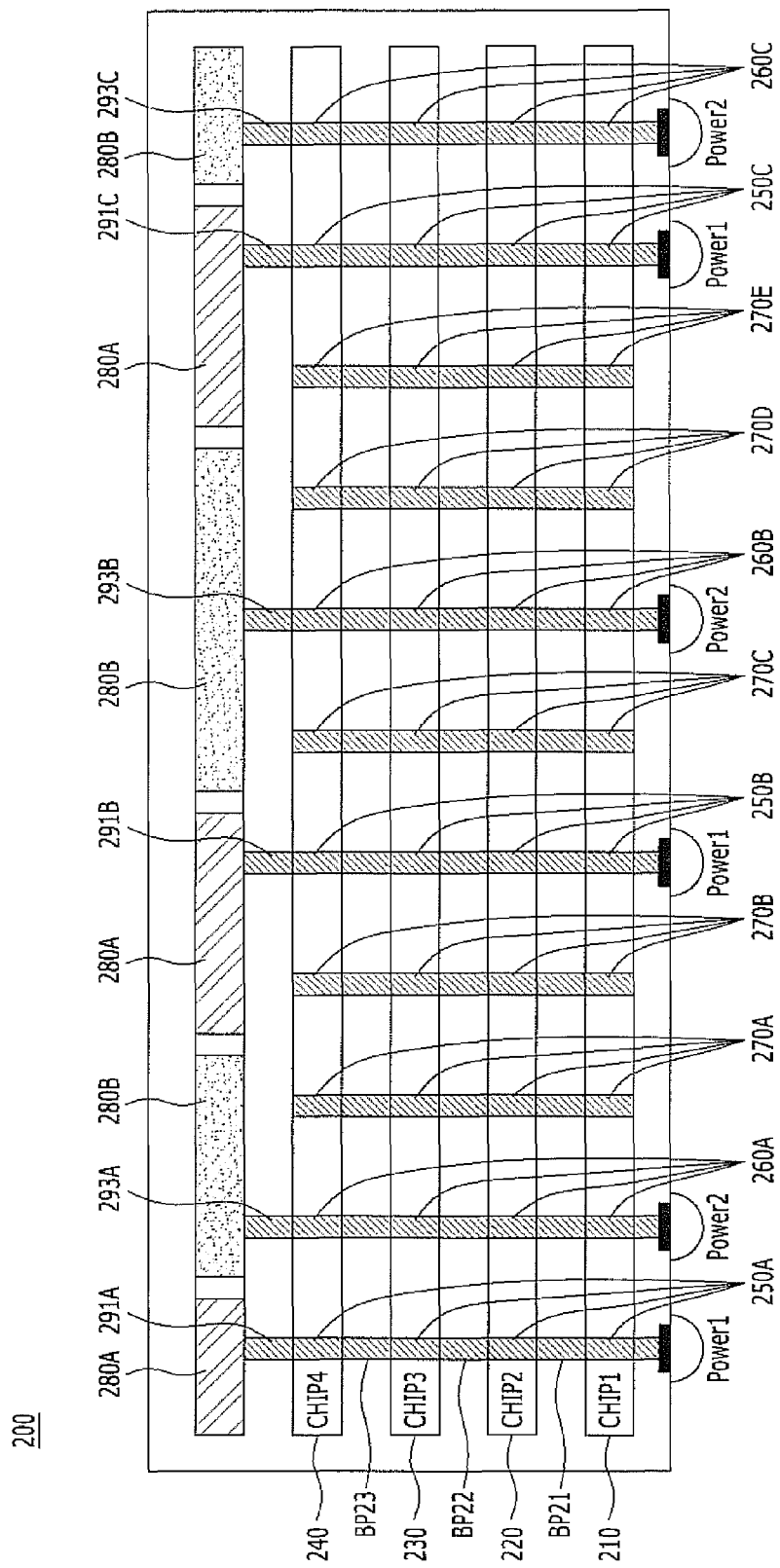
FIG. 3 is a side cross-sectional view of a semiconductor integrated circuit in accordance with a first embodiment of the present invention.
Figure 4:
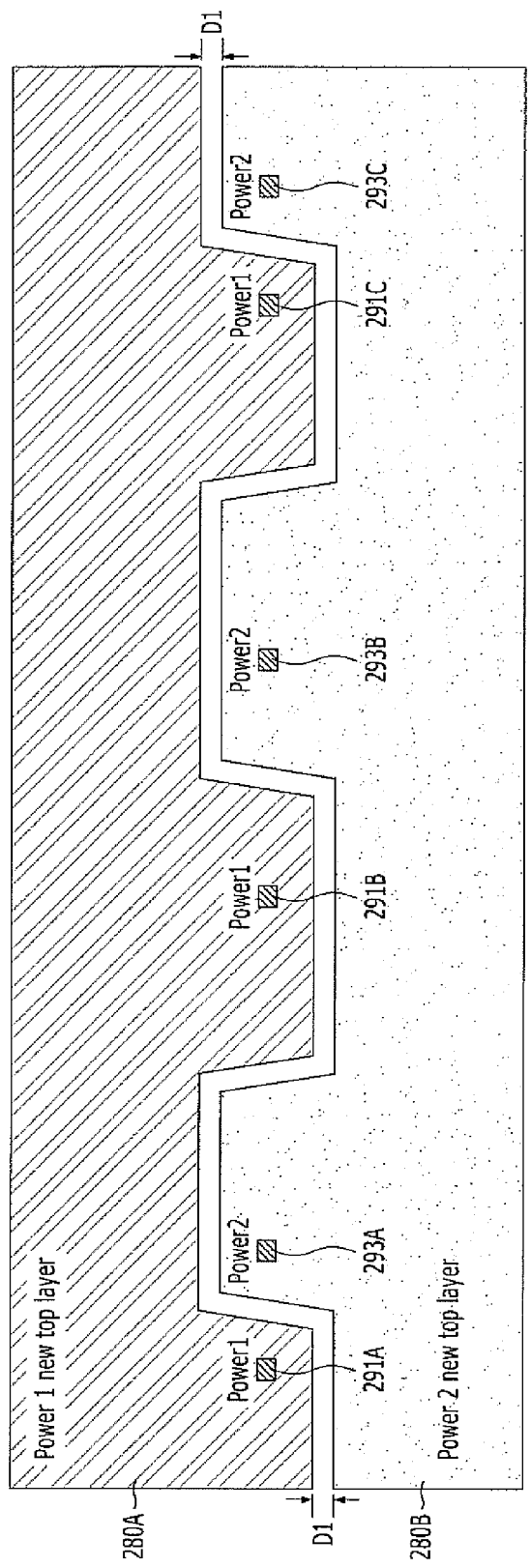
FIG. 4 is a plan view of an uppermost layer including first and second common conductive layers illustrated in FIG. 3.

FIG. 3 is a cross-sectional view of a semiconductor integrated circuit in accordance with a first embodiment of the present invention. FIG. 4 is a plan view of an uppermost layer including first and second common conductive layers illustrated in FIG. 3.

Referring to FIGS. 3 and 4, the semiconductor integrated circuit 200 includes first to fourth semiconductor chips 210 to 240, a plurality of first through-chip vias 250A to 250C, a first common conductive layer 280A, a plurality of first contact portions 291A to 291C, a plurality of second through-chip vias 260A to 260C, a second common conductive layer 280B, a plurality of second contact portions 293A to 293C, a plurality of third through-chip vias 270A to 270E, and a plurality of bump pads BP21 to BP23. The first to fourth semiconductor chips 210 to 240 are stacked vertically. The plurality of first through-chip vias 250A to 250C are vertically formed through the first to fourth semiconductor chips 110 to 140 at a plurality of first positions corresponding to the respective first through-chip vias and configured to operate as an interface for a first power supply. The first common conductive layer 280A is provided over the fourth semiconductor chip 240 stacked at the uppermost position among the first to fourth semiconductor chips 210 to 240, and configured to couple the plurality of through-chip vias 250A to 250C in a horizontal direction. The plurality of first contact portions 291A to 293C are configured to couple the first common conductive layer 280A to the plurality of first through-chip vias 250A to 250C, respectively. The plurality of second through-chip vias 260A to 260C are vertically formed through the first to fourth semiconductor chips 210 to 240 at a plurality of second positions corresponding to the respective second through-chip vias and configured to operate as an interface for a second power supply. The second common layer 280B is provided over the fourth semiconductor chip 240 and configured to couple the plurality of through-chip vias 260A to 260C to each other in the horizontal direction. The plurality of second contact portions 293A to 293C are configured to couple the second common layer 280B to the plurality of second through-chip vias 260A to 260C, respectively. The plurality of third through-chip vias 270A to 270E are configured to operate as an interface for a variety of signals. The plurality of bump pads BP21 to BP23 are provided between the respective through-chip vias 250A to 250C, 260A to 260C, and 270A to 270E and configured to electrically couple corresponding through-chip vias.

The first to fourth semiconductor chips 210 to 240 may be fabricated by using the same process. Here, the first semiconductor chip 210 positioned at the lowermost position serves as a master chip, and the other second to fourth semiconductor chips 220 to 240 serve as slave chips. That is, the first semiconductor chip 210 is configured to transmit a variety of signals and power supplies applied from outside to the second to fourth semiconductor chips 220 to 240, and the second to fourth semiconductor chips 220 to 240 are configured to perform a predetermined operation according to the control of the first semiconductor chip 210.

Since the plurality of first to third through-chip vias 250A to 250C, 260A to 260C, and 270A to 270E are configured to operate as an interface for power supplies or signals, they may be formed of a metal having an excellent conductivity. For example, copper (Cu) may be used. The plurality of first to third through-chip vias 250A to 250C, 260A to 260C, and 270A to 270E include TSVs. In this embodiment, the number of first through-chip vias 250A to 250C, the number of second through-chip vias 260A to 260C, and the number of third through-chip vias 270A to 270E are set to 3, 3, and 5, respectively. Without being limited thereto, however, several hundreds or thousands of through-chip vias are actually provided.

The first and second common conductive layers 280A and 280B are provided in the same layer and may be formed to the same height. Furthermore, referring to FIG. 4, the first and second common conductive layers 280A and 280B are spaced at a desired distance D1 from each other. That is, the first and second layers 280A and 280B are electrically isolated from each other. At this time, the distance D1 between the first and second common conductive layers 280A and 280B defines a gap formed in a prominence and depression shape. Through such a structure, the first and second through-chip vias 250A to 250C and 260A to 260C provided in parallel to one direction may be isolated for each power supply or coupled for the same power supply. That is, the first and second common conductive layers 280A and 280B are provided as power supply mesh means for coupling the plurality of first and second through-chip vias 250A to 250C and 260A to 260C, which are coupled in the vertical direction, in the horizontal direction to each other.

The plurality of first and second contact portions 291A to 291C and 293A to 293C are provided for the first and second through-chip vias 250A to 250C and 260A to 260C, respectively, and serve to substantially couple the first and second contact portions 291A to 291C and 293A to 293C to the first and second common conductive layers 280A and 280B, respectively. The plurality of first and second contact portions 291A to 291C and 293A to 293C and the first and second common conductive layers 280A and 280B may be formed of a metal.

According to the semiconductor integrated circuit 200 in accordance with the first embodiment of the present invention, through-chip vias that are the remotest from a power supply source in the through-chip via structure where the through-chip vias are coupled in the vertical direction are coupled in the horizontal direction through a common conductive layer to each other. Therefore, an effective power supply mesh structure may be implemented. The power supply source may refer to power supply supplied to the first semiconductor chip 210, for example. In the vertical through-chip via structure, an ability to adequately provide a power supply may be decreased by an ohmic drop toward the far end thereof. Therefore, when the through-chip vias positioned at the far end are coupled in the horizontal direction to each other by using the common conductive layer, a power supply may be adequately provided due to the reduction in resistance. Furthermore, between the first and second common conductive layers, a parasitic capacitor is formed, and between the first and second common conductive layers and the uppermost metal layer of the fourth semiconductor chip, a parasitic capacitor may be formed. The parasitic capacitors formed in such a manner contribute to power supply stabilization when the power supply mesh structure is used. That is, the parasitic capacitor operates as a reservoir capacitor.

In the first embodiment of the present invention, it has been described that the first and second common conductive layers are provided at the uppermost layer. However, the first and second common conductive layers may also be provided between semiconductor chips. Furthermore, the bump pads corresponding to each power supply are coupled to the first or second common conductive layer. In this case, a more effective power supply mesh structure is provided. Here, the first and second common conductive layers may be fabricated through the same process.

Figure 5:
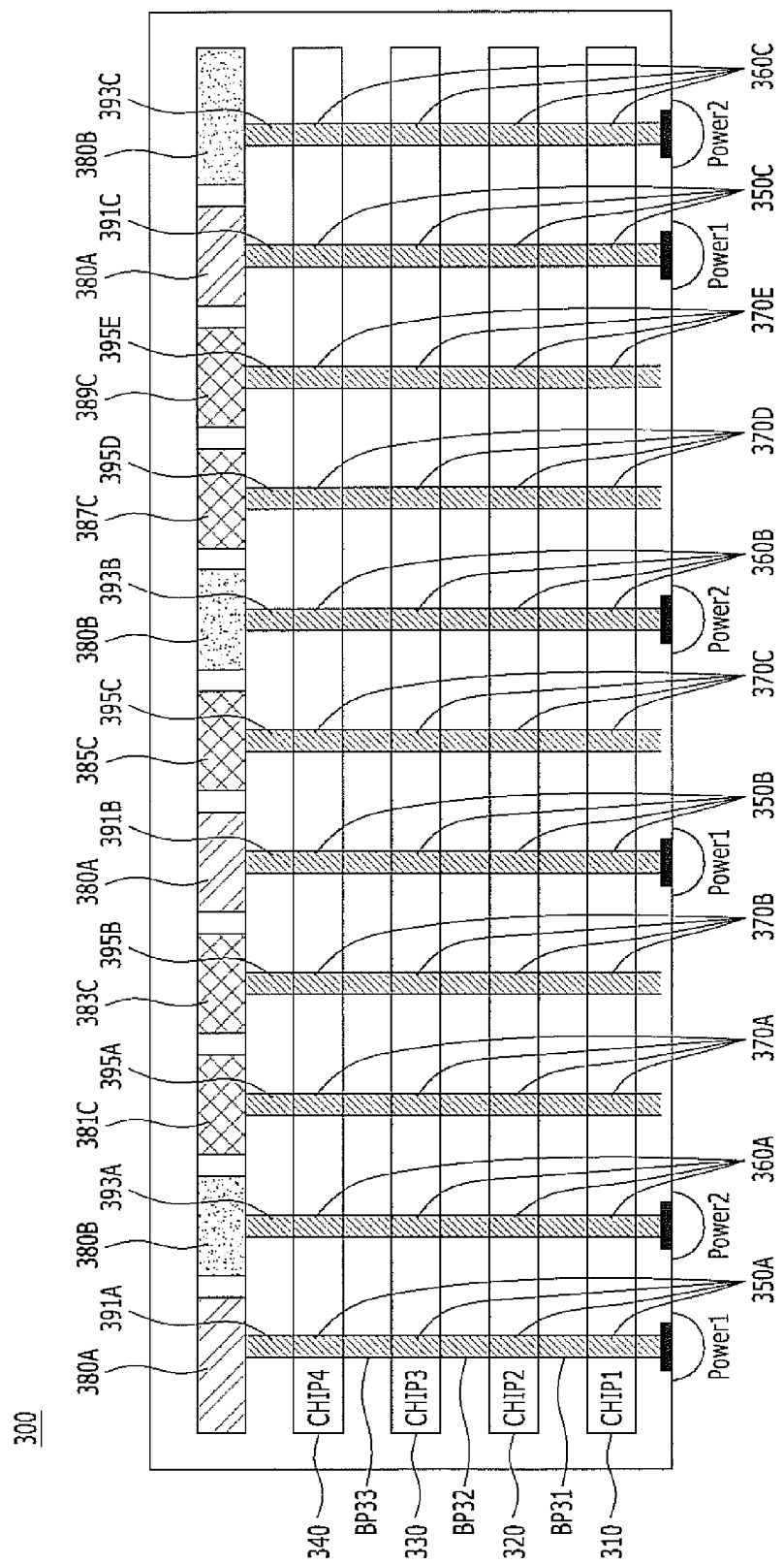
FIG. 5 is a side cross-sectional view of a semiconductor integrated circuit in accordance with a second embodiment of the present invention.
Figure 6:
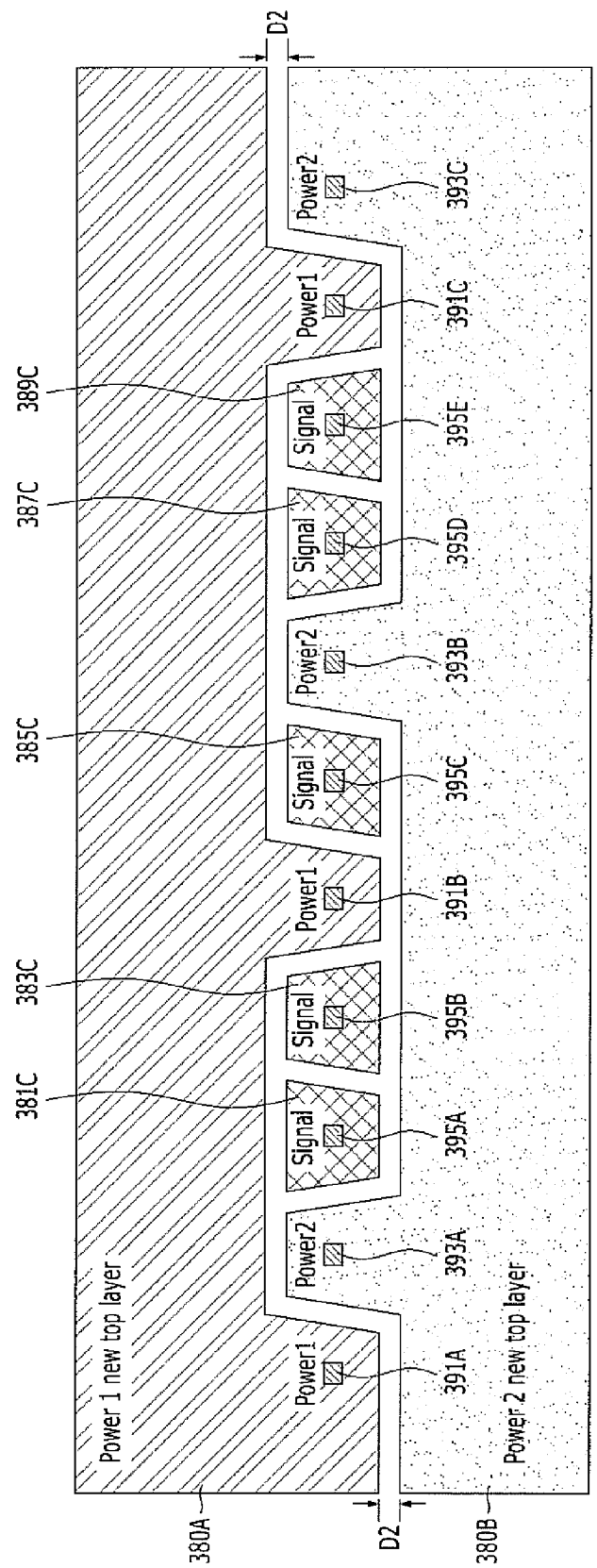
FIG. 6 is a plan view of an uppermost layer including first and second common conductive layers and a plurality of coupling pads, which are illustrated in FIG. 5.

FIG. 5 is a side cross-sectional view of a semiconductor integrated circuit in accordance with a second embodiment of the present invention. FIG. 6 is a plan view of an uppermost layer including first and second common conductive layers and a plurality of coupling pads, which are illustrated in FIG. 5.

The second embodiment of the present invention is characterized in that the semiconductor integrated circuit may analyze signal transfer errors, in addition to the technical characteristics of the first embodiment. Therefore, in this embodiment, the descriptions will be focused on different features compared to the first embodiment of the present invention.

Referring to FIGS. 5 and 6, the semiconductor integrated circuit in accordance with the second embodiment of the present invention further includes a plurality of coupling pads 381C, 383C, 385C, 387C, and 389C and a plurality of third contact portions 395A to 395E. The plurality of coupling pads 381C, 383C, 385C, 387C, and 389C are arranged over the fourth semiconductor chip 340 and coupled to a plurality of through-chip vias 370A to 370E configured to operate as an interface for a variety of signals. The plurality of third contact portions 395A to 395E substantially couple the plurality of coupling pads 381C, 383C, 385C, 387C, and 389C to the plurality of third through-chip vias 370A to 370E, respectively.

The plurality of coupling pads 381C, 383C, 385C, 387C, and 389C are disposed in the same layer as first and second common layers 380A and 380B, and electrically isolated from the first and second common layers 380A and 380B, as illustrated in FIG. 6. At this time, since the plurality of coupling pads 381C, 383C, 385C, 387C, and 389C are used as pads for a probe test, they may be formed to have such a size as to enable performing a probe test.

The plurality of third contact portions 395A to 395E are provided between the plurality of coupling pads 381C, 383C, 385C, 387C, and 389C and the plurality of third through-chip vias 370A to 370E, respectively, so as to correspond one to one. The plurality of third contact portions 395A to 395E serve to substantially couple the plurality of coupling pads 381C, 383C, 385C, 387C, and 389C to the plurality of through-chip vias 370A to 370E, respectively. The third contact portions 395A to 395E and the plurality of coupling pads 381C, 383C, 385C, 387C, and 389C may be formed of a metal.

The semiconductor integrated circuit in accordance with the second embodiment of the present invention may perform a probe test through the coupling pads which are electrically coupled to the through-chip vias for signals, respectively, even in a package state. In other words, a signal transfer fail analysis may be accurately performed through signal monitoring even in a package state. Therefore, since a potential signal transfer fail may be detected in advance, the process time in manufacturing a semiconductor integrated circuit may be shortened, and the operation reliability of the semiconductor integrated circuit may be improved.

In the second embodiment of the present invention, it has been described that the first and second common conductive layers are provided only in the uppermost layer. Without being limited thereto, however, the first and second common conductive layers may also be provided between the respective semiconductor chips. In this case, a more effective power supply mesh structure may be implemented.

In accordance with the embodiments of the present invention, the chip-through vias for the same power supply in the uppermost position of the stacked semiconductor chips are coupled through a conductive layer. Therefore, an effective power supply mesh structure may be implemented while the size of the stacked semiconductor chips is not increased. Accordingly, the semiconductor integrated circuit may resist power supply noise, while having the same size as the conventional semiconductor integrated circuit. Hence, a malfunction is substantially prevented by stable signal transmission, and adequate operation performance is obtained by allowing a high-speed operation.

In addition, since the pads for a probe test as well as the conductive layers for power supply mesh are provided, a signal fail analysis may be performed even in a package state. The pads are electrically isolated from the conductive layers. Therefore, since a potential signal transfer fail may be detected in advance, the process time in manufacturing a semiconductor integrated circuit may be shortened, and adequate operation reliability of the semiconductor integrated circuit may be obtained.

While the present invention has been described with respect to the specific embodiments, it will be apparent to those skilled in the art that various changes and modifications may be made without departing from the spirit and scope of the invention as defined in the following claims.

What is claimed is:

1. A semiconductor integrated circuit comprising:
   a semiconductor chip;
   a plurality of first through-chip vias formed vertically through the semiconductor chip and configured to operate as an interface for a first power supply;
   a first common conductive layer provided over the semiconductor chip and coupling the plurality of first through-chip vias to each other in a horizontal direction;
   a plurality of second through-chip vias formed vertically through the semiconductor chip and configured to operate as an interface for a second power supply; and
   a second common conductive layer provided over the semiconductor chip and coupling the plurality of second through-chip vias to each other in the horizontal direction,
   wherein the first and second common conductive layers are coplanar.

2. The semiconductor integrated circuit of claim 1, further comprising a plurality of first contact portions that couple the first common conductive layer to the plurality of first through-chip vias.

3. The semiconductor integrated circuit of claim 2, wherein the first common conductive layer and the plurality of first contact portions are formed of a metal.

4. The semiconductor integrated circuit of claim 1, further comprising a plurality of second contact portions coupling the second common conductive layer to the plurality of second through-chip vias.

5. The semiconductor integrated circuit of claim 2, wherein the second common conductive layer and the plurality of second contact portions are formed of a metal.

6. The semiconductor integrated circuit of claim 1, wherein the first and second common conductive layers are spaced from each other by a gap and the gap has a constant width throughout the entire length of the opposing first and second common conductive layers.

7. The semiconductor integrated circuit of claim 1, wherein the first and second common conductive layers are spaced from each other by a gap and the gap has a constant width throughout the entire length of the opposing first and second common conductive layers.

8. The semiconductor integrated circuit of claim 7, wherein the gap between the first and second common conductive layers forms convex and concave shapes on the first and second conductive layers.

9. The semiconductor integrated circuit of claim 1, wherein the plurality of first and second through-chip vias comprise through-silicon vias (TSVs).

10. A semiconductor integrated circuit comprising:
    a plurality of semiconductor chips stacked in a vertical direction;
    a plurality of first through-chip vias formed vertically through the plurality of semiconductor chips and configured to operate as an interface for a first power supply;
    a first common conductive layer provided over a semiconductor chip stacked at the uppermost position among the plurality of stacked semiconductor chips and coupling the plurality of first through-chip vias to each other in a horizontal direction;
    a plurality of second through-chip vias formed vertically through the stacked semiconductor chip and configured to operate as an interface for a second power supply; and
    a second common conductive layer provided over the semiconductor chip stacked at the uppermost position among the plurality of stacked semiconductor chips and coupling the plurality of second through-chip vias to each other in the horizontal direction,
    wherein the first and second common conductive layers are coplanar.

11. The semiconductor integrated circuit of claim 10, further comprising a plurality of first contact portions coupling the first common contact layer to the plurality of first through-chip vias.

12. The semiconductor integrated circuit of claim 11, wherein the first common conductive layer and the plurality of first contact portions are formed of a metal.

13. A semiconductor integrated circuit comprising:
    a plurality of semiconductor chips stacked in a vertical direction;
    a plurality of first through-chip vias formed vertically through the plurality of semiconductor chips at a plurality of first positions corresponding to the first through-chip vias, respectively, and configured to operate as an interface for a first power supply;
    a first common conductive layer provided over a semiconductor chip stacked at the uppermost position among the plurality of semiconductor chips and coupling the plurality of first through-chip vias to each other in a horizontal direction;
    a plurality of second through-chip vias formed vertically through the plurality of semiconductor chips at a plurality of second positions corresponding to the second through-chip vias, respectively, and configured to operate as an interface for a second power supply;
    a plurality of coupling pads arranged in a same layer as the first common conductive layer and coupled to the second through-chip vias, respectively;
    a plurality of third through-chip vias formed vertically through the plurality of semiconductor chips at a plurality of third positions corresponding to the third through-chip vias, respectively, and configured to operate as an interface for signals; and a second common conductive layer provided over the semiconductor chip stacked at the uppermost position and coupling the plurality of second through-chip vias to each other,
wherein the first and second common conductive layers are coplanar.

14. The semiconductor integrated circuit of claim 13, further comprising a plurality of first contact portions coupling the first common conductive layer to the plurality of first through-chip vias.

15. The semiconductor integrated circuit of claim 13, further comprising a plurality of second contact portions coupling the plurality of second through-chip vias to the plurality of coupling pads.

16. The semiconductor integrated circuit of claim 13, the first common conductive layer and the plurality of first and second contact portions are formed of a metal.

17. The semiconductor integrated circuit of claim 13, wherein the plurality of coupling pads comprise pads for a probe test.

* * * * *